US012660370B2

(12) United States Patent
Chiang

(10) Patent No.: US 12,660,370 B2
(45) Date of Patent: Jun. 16, 2026

(54) PHOTO DETECTOR AND MANUFACTURING METHOD THEREOF

(71) Applicant: Taiwan Semiconductor Manufacturing Company, Ltd., Hsinchu (TW)

(72) Inventor: Chen-Hao Chiang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 434 days.

(21) Appl. No.: 18/143,707

(22) Filed: May 5, 2023

(65) Prior Publication Data

US 2024/0372019 A1 Nov. 7, 2024

(51) Int. Cl.
| | |
|---|---|
| *H10F 77/70* | (2025.01) |
| *G02B 6/12* | (2006.01) |
| *H10F 30/223* | (2025.01) |
| *H10F 71/00* | (2025.01) |
| *H10F 77/14* | (2025.01) |

(52) U.S. Cl.
CPC ....... *H10F 77/703* (2025.01); *G02B 6/12004* (2013.01); *H10F 30/223* (2025.01); *H10F 71/1212* (2025.01); *H10F 77/14* (2025.01)

(58) Field of Classification Search
CPC .... H10F 30/223; H10F 77/14; G02B 6/12004
See application file for complete search history.

(56) References Cited

U.S. PATENT DOCUMENTS

| | | | | |
|---|---|---|---|---|
| 2021/0135024 A1* | 5/2021 | Chiang | ................. | G02B 6/136 |
| 2022/0131017 A1* | 4/2022 | Chiang | ................. | H10F 77/306 |
| 2022/0344523 A1* | 10/2022 | Chowdhury | ........... | G02B 6/243 |

* cited by examiner

*Primary Examiner* — Matthew L Reames
(74) *Attorney, Agent, or Firm* — Birch, Stewart, Kolasch & Birch, LLP

(57) ABSTRACT

A photo detector includes a substrate, an exciting layer, a first insulation layer, a second insulation layer and a waveguide. The substrate has a recess. The exciting layer is formed in the recess and having a light incident surface and, a first side and a second side opposite to the first side. The first insulation layer is formed in the substrate and disposed on the first side of the exciting layer. The second insulation layer is formed in the substrate and disposed on the second side of the exciting layer. The waveguide is obliquely connected to the light incident surface of the exciting layer. There is an acute angle included between the light incident surface and an extension direction of the waveguide.

20 Claims, 5 Drawing Sheets

PHOTO DETECTOR AND MANUFACTURING METHOD THEREOF

BACKGROUND

A photo detector may receive a light and transform the light into a current. However, a higher responsivity resulted from the sufficient (or long) absorption length will increase a dark current, yet it also reduces bandwidth. Thus, a trade-off between high responsivity and low dark current is needed to be cautiously considered.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
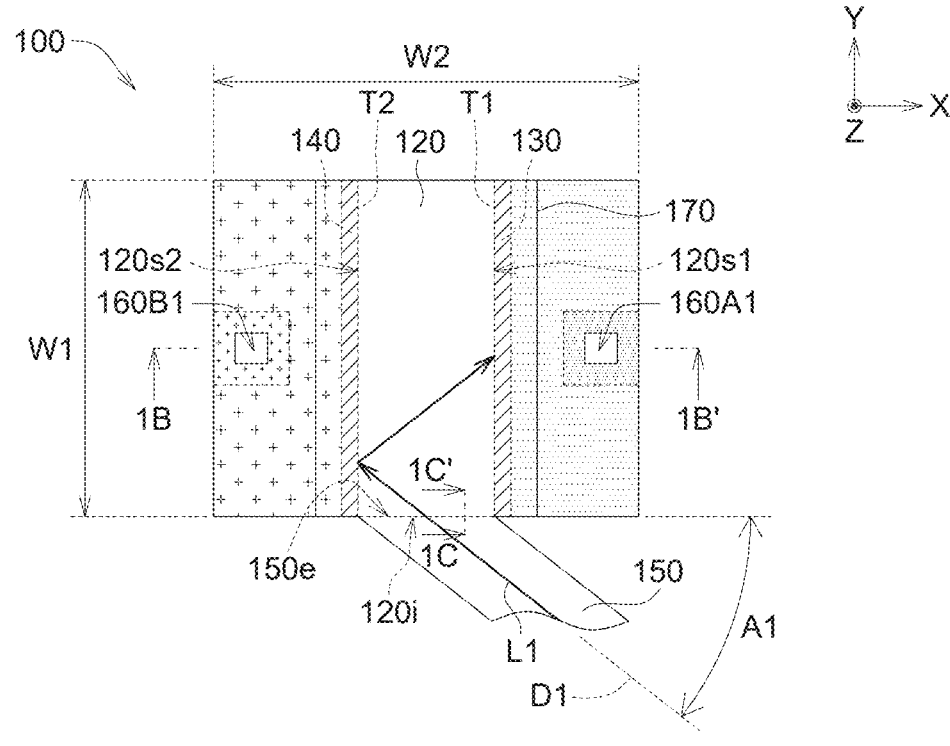
FIG. 1A illustrates a schematic diagram of a top-view of a photo detector according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1B:
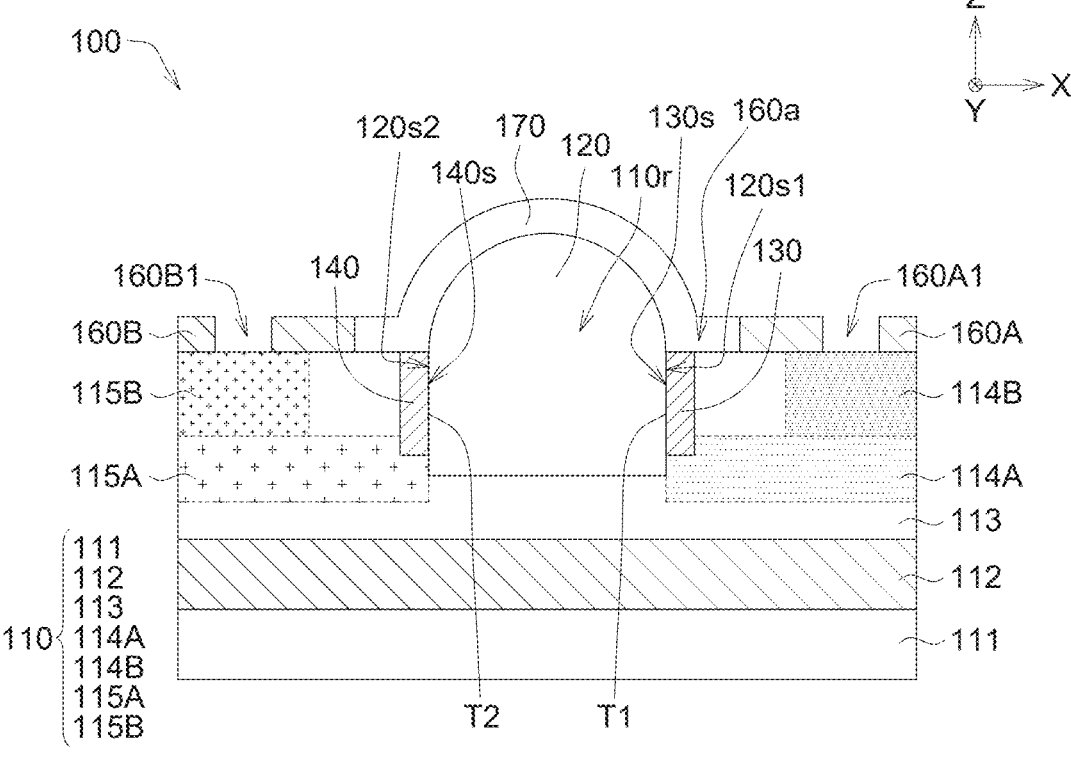
FIGS. 1B and 1C illustrate a cross-sectional view of the photo detector of FIG. 1A along a direction 1B-1B' and a cross-sectional view of the photo detector of FIG. 1A along a direction 1C-1C' respectively.
Figure 1C:
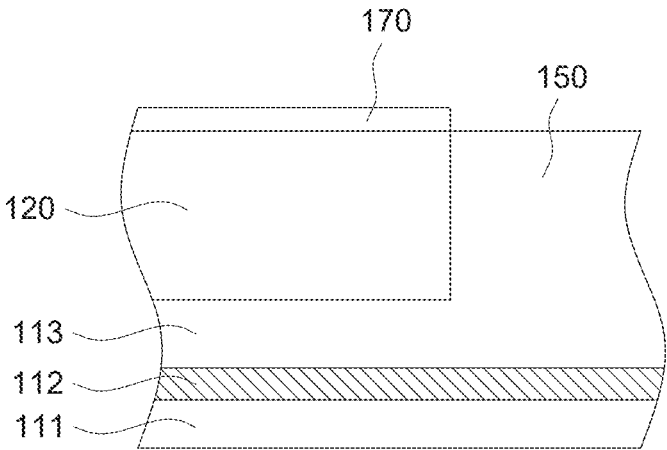

Referring to FIGS. 1A to 1C, FIG. 1A illustrates a schematic diagram of a top-view of a photo detector 100 according to an embodiment of the present disclosure, and FIGS. 1B and 1C illustrate a cross-sectional view of the photo detector of FIG. 1A along a direction 1B-1B' and a cross-sectional view of the photo detector of FIG. 1A along a direction 1C-1C' respectively.

The photo detector 100 is, for example, a germanium (Ge) PIN photodetector (PD).

As illustrated in FIGS. 1A and 1B, the photo detector 100 includes a substrate 110, an exciting layer 120, a first insulation layer 130, a second insulation layer 140, a waveguide 150, a first insulation layer 160A, a second insulation layer 160B and a protection layer 170. The substrate 110 has at least one recess 110r. The exciting layer 120 is formed in the recess 110r and has a light incident surface 120i, a first side (or lateral surface) 120s1 and a second side 120s2 opposite to the first side 120s1. The first insulation layer 130 is formed in the substrate 110 and disposed on the first side 121s1 of the exciting layer 120. The second insulation layer 140 is formed in the substrate 110 and disposed on the second side 120s2 of the exciting layer 120. The waveguide 150 is obliquely connected to the light incident surface 120i of the exciting layer 120. There is an acute angle A1 included between the light incident surface 120i and an extension direction DI of the waveguide 150. As a result, a path length of an incident light L1 within the exciting layer 120 may be increased and accordingly it may increase the responsivity. In addition, the photo detector 100 has a length W1 which may be shortened due to a path length of the incident light L1 within the exciting layer 120 being increased, and accordingly it may reduce the dark current and increase the bandwidth by small capacitance in RC time constant.

In other words, in the present embodiment, in the case of the photo detector 100 being shortened, the lower dark current may be obtained, and simultaneously the higher responsivity and the higher bandwidth also may be obtained. Or, the higher responsivity may be obtained even if the photo detector 100 is shortened.

In an embodiment, the exciting layer 120 has a first refractive index R1, the first insulation layer 130 has a second refractive index R2, the second insulation layer 140 has a third refractive index R3, and the first refractive index R1 is greater than the second refractive index R2 and the third refractive index R3, namely R1>R2 and R1>R3. As a result, a Total Internal Reflection (TIR) of the incident light L1 within the exciting layer 120 may be obtained.

Furthermore, the exciting layer 120 is, for example, a Ge layer (or pure Ge layer). The first insulation layer 130 and the second insulation layer 140 are silicon oxide (for example, SiO$_2$) layers. Accordingly, the first refractive index R1 of the exciting layer 120 is 4.2, the second refractive index R2 of the first insulation layer 130 is 1.4 and the third refractive index R3 of the second insulation layer 140 is 1.4. The acute angle (or referred as to an incident angle) A1 is, for example, the acute angle A1 is less than 30 degrees, for example, ranging between 19.5 degrees and 30 degrees. As a result, TIR may be obtained according to Snell's Law. However, such exemplification is not meant to be for limiting, and the acute angle A1 may depend on the material of the exciting layer 120, the first insulation layer 130 and the second insulation layer 140. In another embodiment, the exciting layer 120, the first insulation layer 130 and/or the second insulation layer 140 may be formed of different material, or the exciting layer 120, the first insulation layer 130 and/or the second insulation layer 140 may have different refractive index.

Assuming that the path length of the incident light is P1 when the acute angle A1 is 90 degrees, the path length P2 of the incident light L1 within the exciting layer 120 in the present embodiment may be obtained by the following formula (1).

$$P2 = \frac{P1}{\sin(A1)} \qquad (1)$$

For example, compared to the acute angle A1 being 90 degrees, the path length of the incident light L1 within the exciting layer 120 may be increased by two times when the acute angle A1 is 30 degrees. As a result, compared to the acute angle A1 being 90 degrees, the length W1 of the photo detector 100 may be shortened by 2 times (according to formula (1), $$\frac{P2}{P1} = \frac{1}{\sin(360°)} = 2)$$

when the acute angle A1 is 30 degrees, and accordingly it may reduce dark current due to the reduction of the exciting layer material (the shorter the length W1 of the photo detector 100 is, the less the exciting layer material is, the less the defects of the exciting layer is and the smaller the dark current is). In a comparative example, if the first insulation layer 130 and/or the second insulation layer 140 are replaced by silicon (Si), the path length of the incident light L1 within the exciting layer 120 will shortened due to the refractive index of silicon (for example, 3.5) is greater than that of silicon oxide (for example, 1.4).

The photo detector 100 has the length W1 in Y axis and a width W2 in X axis. In an embodiment, due to the length W1 of the photo detector 100 being allowed to be shortened, a ratio of the length W1 to the width W2 ranges between 10 and 40, for example, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, greater or smaller. In addition, the value of the ratio is, for example, real number.

As illustrated in FIGS. 1A and 1B, the substrate 110 includes a first base 111, an oxide layer 112, a second base 113, a first light-doped region 114A, a first heavy-doped region 114B, a second light-doped region 115A and a second heavy-doped region 115B. The oxide layer 112 is formed between the first base 111 and the second base 113. The first light-doped region 114A, the first heavy-doped region 114B3, the second light-doped region 115A and the second heavy-doped region 115B are formed within the second base 113.

The first base 111 may be formed of a material including, for example, silicon, and the second base 113 may be formed of a material including, for example, silicon. The first light-doped region 114A and the first heavy-doped region 114B are, for example, one of P-type semiconductor and N-type semiconductor. The second light-doped region 115A and the second heavy-doped region 115B are, for example, another of P-type semiconductor and N-type semiconductor. The first light-doped region 114A, the first heavy-doped region 114B, second light-doped region 115A and the second heavy-doped region 115B may be formed by using, for example, an ion implantation, etc.

When the light within the exciting layer 120 is absorbed by the exciting layer 120, the hole may flow toward the P-type semiconductor which is applied by a positive voltage, while the electron may flow toward the N-type semiconductor which is applied by a negative voltage. Furthermore, when a reverse bias voltage is applied to the P/N terminal, the electron/hole generated by the light which is absorbed by the layer 120 will be affected by the electric field. As a result, the electrons flow toward the N-type, and the holes flow toward the P-type. Although not illustrated, a first electrode may be connected to the first heavy-doped region 114B, the second electrode may be connected to the second heavy-doped region 115B, and an electronic circuit connects the first electrode and the second electrode. As a result, the photo detector 100, the first electrode, the second electrode and the electronic circuit may form a current loop to transmit the current.

As illustrated in FIGS. 1A and 1B, the first insulation layer 130 is in contact with the first side 120s1 of the exciting layer 120, and the second insulation layer 140 is in contact with the second side 120s2 of the exciting layer 120. As a result, a first TIR interface T1 may be formed between the exciting layer 120 and the first insulation layer 130, a second TIR interface T2 may be formed between the exciting layer 120 and the second insulation layer 140 for obtaining better TIR.

As illustrated in FIGS. 1A and 1B, the first insulation layer 130 has a first lateral surface 130s, the second insulation layer 140 has a second lateral surface 140s, and the first lateral surface 130s and the second lateral surface 140s are exposed from the recess 110r. In an embodiment, the first insulation layer 130 and the second insulation layer 140 are, for example, STI (Shallow Trench Isolation) layers which may be formed of a material including, for example, silicon oxide.

As illustrated in FIG. 1A, the waveguide 150 has an exit surface 150e which is in contact with the light incident surface 120i of the exciting layer 120. The waveguide 150 is formed of a material including, for example, silicon. The incident light L1 may travel through the waveguide 150 and be incident to the exciting layer 120 through the exit surface 150e and the light incident surface 120i. The waveguide 150 and the second base 113 are, for example, the same level layer. Furthermore, a layer (for example, a silicon layer) may be patterned to form the second base 113 and the waveguide 150 by using, for example, lithography (at least including etching/exposure/developing), etc.

As illustrated in FIG. 1B, the first insulation layer 160A and the second insulation layer 160B are formed on the second base 113 and located at adjacent two sides of the exciting layer 120 respectively. The first insulation layer 160A has at least one first opening 160A1 to expose the first heavy-doped region 114B. The second insulation layer 160B has at least one second opening 160B1 to expose the second heavy-doped region 115B. The photo detector 100 further has at least one opening 160a extends from the recess 110r outward. In addition, the first insulation layer 160A and/or the second insulation layer 160B are formed of a material including, for example, a light-transmitting material or an opaque material.

As illustrated in FIG. 1B, the protection layer 170 is formed within the opening 160a and covers the exciting layer 120. In an embodiment, the protection layer 170 is formed of a material including, for example, silicon nitride, etc. The protection layer 170 may protect the exciting layer 120 to prevent the exciting layer 120 from being damaged by heat or acid in subsequent processes and also prevent the exciting layer 120 from leaking out in subsequent processes to contaminate other components.

As illustrated in FIGS. 2A to 2E, FIGS. 2A to 2E illustrate schematic diagrams of manufacturing processes of the photo detector 100 of FIG. 1A.

Figure 2A:
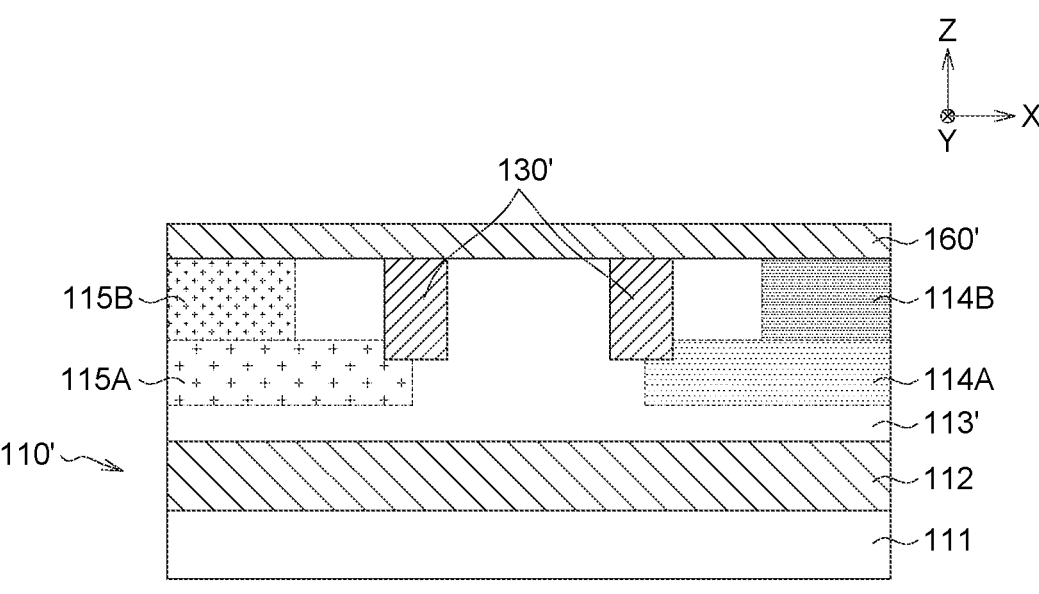
FIGS. 2A to 2E illustrate schematic diagrams of manufacturing processes of the photo detector of FIG. 1A.

As illustrated in FIG. 2A, a substrate 110' is provided. The substrate 110' includes the first base 111, the oxide layer 112, a second base material 113', the first light-doped region 114A, the first heavy-doped region 114B, the second light-doped region 115A and the second heavy-doped region 115B. The oxide layer 112 is formed between the first base 111 and the second base material 113'. The first light-doped region 114A, the first heavy-doped region 114B, the second light-doped region 115A and the second heavy-doped region 115B are formed within the second base material 113'.

As illustrated in FIG. 2A, the first base 111 may be formed of a material including, for example, silicon, and the second base material 113' may be formed of a material including, for example, silicon. The first light-doped region 114A and the first heavy-doped region 114B are, for example, one of P-type semiconductor and N-type semiconductor. The second light-doped region 115A and the second heavy-doped region 115B are, for example, another of P-type semiconductor and N-type semiconductor. The first light-doped region 114A, the first heavy-doped region 114B, second light-doped region 115A and the second heavy-doped region 115B may be formed by using, for example, an ion implantation, etc.

As illustrated in FIG. 2A, the waveguide 150 (illustrated in FIG. 1A) may be connected to the second base material 113'. Furthermore, a base layer may be patterned to form the waveguide 150 and the second base material 113' by using, for example, lithography, etc. The base layer may be formed of a material including, for example, silicon.

As illustrated in FIG. 2A, an insulation layer material 130' may be formed within the second base material 113'. In the present embodiment, the insulation layer material 130' includes two separated portions. In another embodiment, the insulation layer material 130' may be single continuous portion. The insulation layer material 130' may be formed of a material including, for example, silicon oxide. Then, another insulation layer material 160' over the second base material 113' and the insulation layer material 130' may be formed by using, for example, deposition, etc.

Figure 2B:
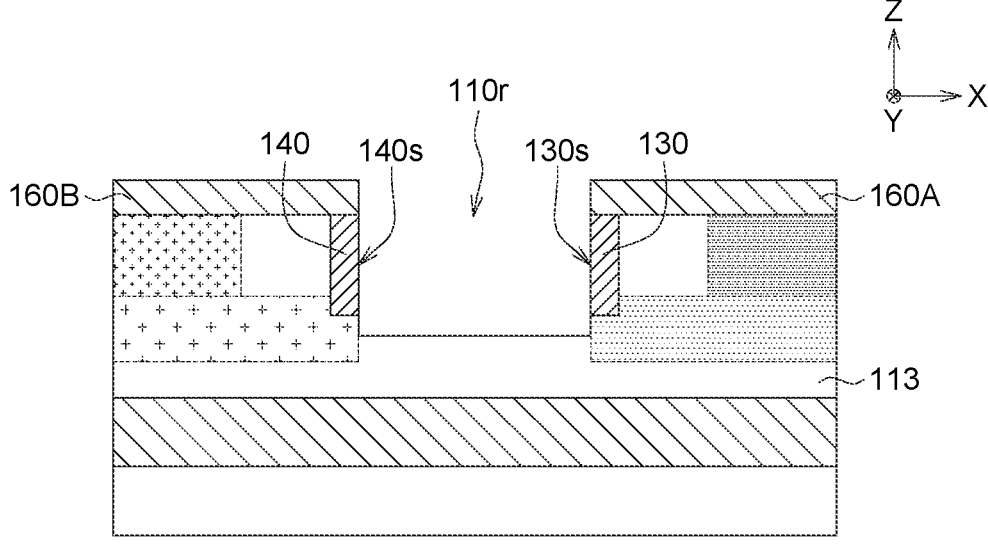

As illustrated in FIG. 2B, the recess 110r may be formed on the substrate 100' by using, for example, lithography, etc. In an embodiment, the recess 110r passes through the insulation layer material 160' to form the first insulation layer 160A and the second insulation layer 160B, passes through the insulation layer material 130' to form the first insulation layer 130 and the second insulation layer 140, and passes through a portion of the second base material 113' to form the second base 113. The first insulation layer 130 and the second insulation layer 140 are located at two adjacent sides of the recess 110r respectively, and the first insulation layer 160A and the second insulation layer 160B also are located at two adjacent sides of the recess 110r respectively. The first insulation layer 130 has the first lateral surface 130s, the second insulation layer 140 has the second lateral surface 140s, and the first lateral surface 130s and the second lateral surface 140s are exposed from the recess 110r or face the recess 110r. In addition, the recess 110r exposes the exit surface 150e (illustrated in FIG. 1A) of the waveguide 150 (illustrated in FIG. 1A).

Figure 2C:
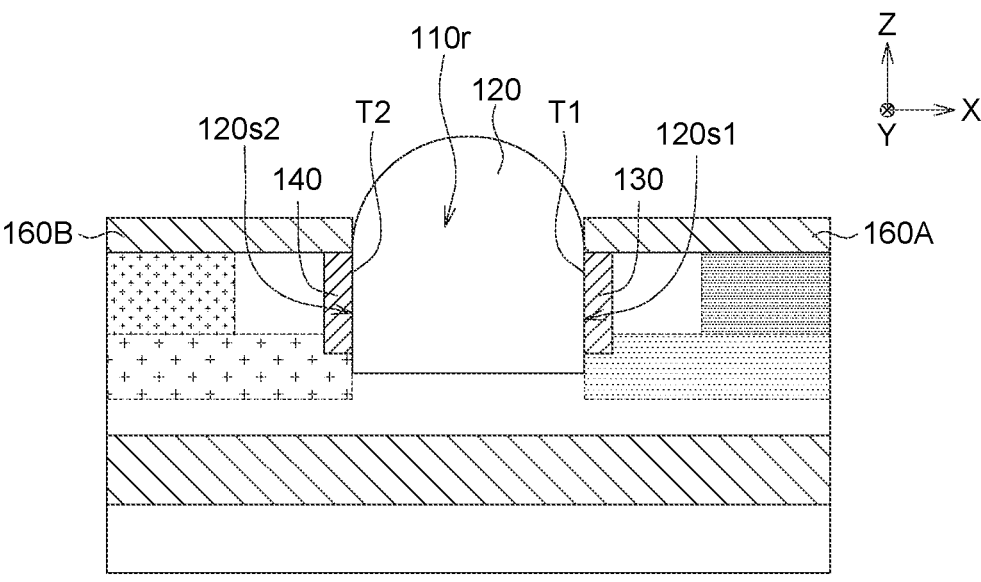

As illustrated in FIG. 2C, the exciting layer 120 is formed in the recess 110r by using, for example, deposition, wherein the exciting layer 120 has the light incident surface 120i (illustrated in FIG. 1A), the first side 120s1 and the second side 120s² opposite to the first side 120s1, the first side 120s1 of the exciting layer 120 is connected to the first insulation layer 130, the second side 120s2 of the exciting layer 120 is connected to the second insulation layer 140, the light incident surface 120i (illustrated in FIG. 1A) is connected to the exit surface 150e (illustrated in FIG. 1A) of the waveguide 150 (illustrated in FIG. 1A). The waveguide 150 is obliquely connected to the light incident surface 120i of the exciting layer 120, and there is the acute angle A1 (illustrated in FIG. 1A) included between the light incident surface 120i and the extension direction DI (illustrated in FIG. 1A) of the waveguide 150.

In addition, after the exciting layer 120 is formed, the first insulation layer 130 is in contact with the first side 120s1 of the exciting layer 120, and the second insulation layer 140 is in contact with the second side 120s2 of the exciting layer 120. As a result, the first TIR interface T1 is formed between the exciting layer 120 and the first insulation layer 130, and the second TIR interface T2 is formed between the exciting layer 120 and the second insulation layer 140 for obtaining better TIR.

Figure 2D:
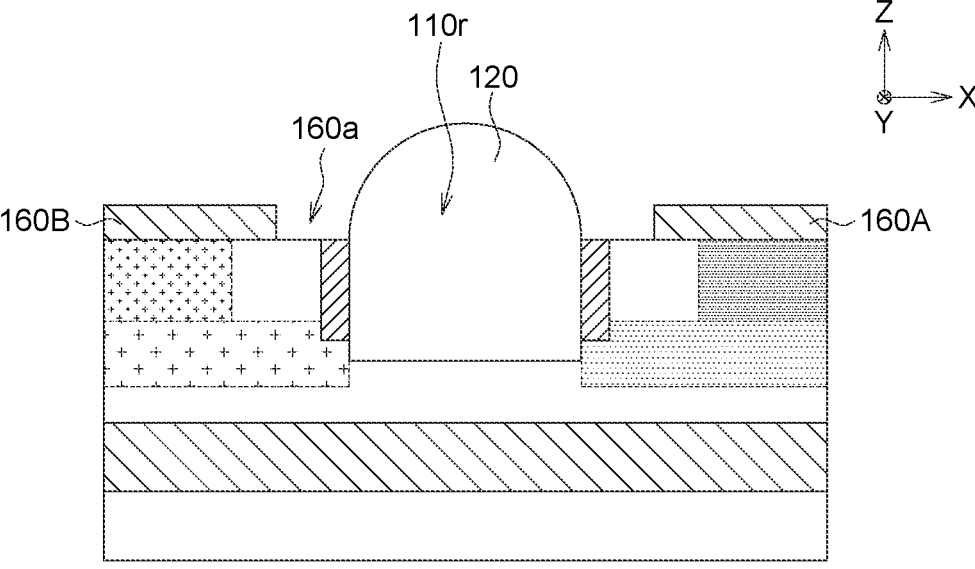

As illustrated in FIG. 2D, an opening 160a is formed by using, for example, lithography, etc. The opening 160a extends from the recess 110r outward.

Figure 2E:
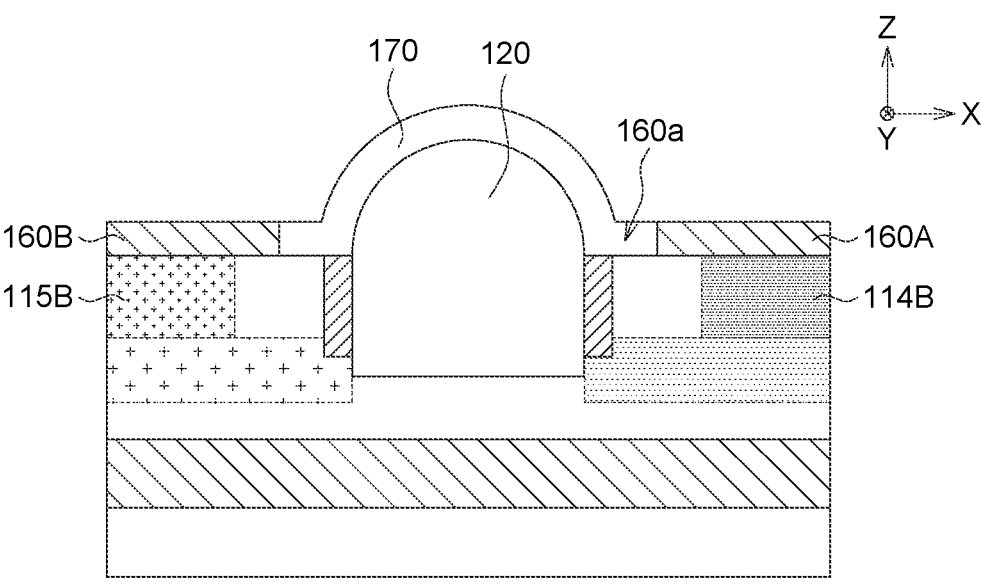

As illustrated in FIG. 2E, the protection layer 170 over the exciting layer 120 is formed on the opening 160a. The protection layer 170 is formed of a material including, for example, silicon nitride, etc. The protection layer 170 may protect the exciting layer 120 to prevent the exciting layer 120 from being damaged by heat or acid in subsequent processes and also prevent the exciting layer 120 from leaking out in subsequent processes to contaminate other components.

Then, the first opening 160A1 is formed on first insulation layer 160A to expose the first heavy-doped region 114B, and the second opening 160B1 is formed on the second insulation layer 160B to expose the second heavy-doped region 115B by using, for example, lithography, etc.

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

According to the present disclosure, a photo detector includes an exciting layer and a waveguide. The exciting layer has a light incident surface. The waveguide is obliquely connected to the light incident surface of the exciting layer. There is an acute angle included between the light incident surface and an extension direction of the waveguide. Accordingly, a path length of an incident light within the exciting layer may be increased and accordingly it may increase the responsivity.

Example embodiment 1: a photo detector includes a substrate, an exciting layer, a first insulation layer, a second insulation layer and a waveguide. The substrate has a recess. The exciting layer is formed in the recess and having a light incident surface and, a first side and a second side opposite to the first side. The first insulation layer is formed in the substrate and disposed on the first side of the exciting layer. The second insulation layer is formed in the substrate and disposed on the second side of the exciting layer. The waveguide is obliquely connected to the light incident surface of the exciting layer. There is an acute angle included between the light incident surface and an extension direction of the waveguide.

Example embodiment 2 based on Example embodiment 1: the first insulation layer is in contact with the first side of the exciting layer, and the second insulation layer is in contact with the second side of the exciting layer.

Example embodiment 3 based on Example embodiment 1: the first insulation layer has a first lateral surface, the second insulation layer has a second lateral surface, and the first lateral surface and the second lateral surface are exposed from the recess.

Example embodiment 4 based on Example embodiment 1: the first insulation layer and the second insulation layer are STI layers.

Example embodiment 5 based on Example embodiment 1: the exciting layer has a first refractive index, the first insulation layer has a second refractive index, the second insulation layer has a third refractive index, and the first refractive index is greater than the second refractive index and the third refractive index.

Example embodiment 6 based on Example embodiment 1: the exciting layer is a germanium layer, and the first insulation layer and the second insulation layer are silicon oxide layers.

Example embodiment 7 based on Example embodiment 1: the acute angle is less than 30 degrees.

Example embodiment 8 based on Example embodiment 1: the acute angle ranges between 19.5 degrees and 30 degrees.

Example embodiment 9 based on Example embodiment 1: the photo detector further includes a first TIR interface and a second TIR interface, wherein the first TIR interface is formed between the exciting layer and the first insulation layer, and the second TIR interface is formed between the exciting layer and the second insulation layer.

Example embodiment 10 based on Example embodiment 1: the exciting layer has a length and a width, and a ratio of the length to the width ranges between 10 and 40.

Example embodiment 11: a photo detector includes a substrate, a germanium layer, a first STI layer, a second STI layer and a waveguide. The substrate has a recess. The germanium layer is formed in the recess and has a light incident surface, a first side and a second side opposite to the first side. The first STI layer is formed on the substrate and in contact with the first side of the exciting layer. The second STI layer is formed on the substrate and in contact with the second side of the exciting layer. The waveguide is obliquely connected to the light incident surface of the germanium layer.

Example embodiment 12 based on Example embodiment 11: the germanium layer has a first refractive index, the first STI layer has a second refractive index, the second STI layer has a third refractive index, and the first refractive index is greater than the second refractive index and the third refractive index.

Example embodiment 13 based on Example embodiment 11: the first STI layer and the second STI layer are formed of a material comprising silicon oxide.

Example embodiment 14 based on Example embodiment 11: the waveguide obliquely is connected to the light incident surface of the germanium layer acute angle in an extension direction, there is an acute angle included between the light incident surface and the extension direction, and the acute angle is less than 30 degrees.

Example embodiment 15 based on Example embodiment 11: the waveguide obliquely is connected to the light incident surface of the germanium layer acute angle in an extension direction, there is an acute angle included between the light incident surface, and the acute angle ranges between 19.5 degrees and 30 degrees.

Example embodiment 16 based on Example embodiment 11: the first STI layer has a first lateral surface, the second STI layer has a second lateral surface, and the first lateral surface and the second lateral surface are exposed from the recess.

Example embodiment 17 based on Example embodiment 11: the photo detector further includes a first TIR interface and a second TIR interface, wherein the first TIR interface is formed between the exciting layer and the first insulation layer, and the second TIR interface is formed between the exciting layer and the second insulation layer.

Example embodiment 17 based on Example embodiment 11: the germanium layer has a length and a width, and a ratio of the length to the width ranges between 10 and 40.

Example embodiment 19: a manufacturing method of a photo detector includes: providing a substrate, wherein a first insulation layer, a second insulation layer and a waveguide are formed in the substrate; forming a recess in the substrate; and forming an exciting layer in the recess, wherein the exciting layer has a light incident surface, a first side and a second side opposite to the first side, the first insulation layer is disposed on the first side of the exciting layer, and the second insulation layer is disposed on the second side of the exciting layer, the waveguide is obliquely connected to the light incident surface of the exciting layer, and there is an acute angle included between the light incident surface and an extension direction of the waveguide.

Example embodiment 20 based on Example embodiment 19: in forming the recess in the substrate, the recess passes through the first insulation layer and the second insulation layer to expose a first lateral surface of the first insulation layer and a second lateral surface of the second insulation layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A manufacturing method of a photo detector, comprising:

providing a substrate, wherein a first insulation layer, a second insulation layer, a doped region and a waveguide are formed in the substrate;

forming a recess in the substrate; and forming an exciting layer in the recess, wherein the exciting layer has a light incident surface, a first side and a second side opposite to the first side, the first insulation layer is disposed on the first side of the exciting layer, and the second insulation layer is disposed on the second side of the exciting layer, the waveguide is obliquely connected to the light incident surface of the exciting layer, and there is an acute angle included between the light incident surface and an extension direction of the waveguide;

wherein the first insulation layer has a first lateral surface exposed from the recess, the doped region has a lateral surface exposed from the recess, and the first lateral surface of the first insulation layer extends to the lateral surface of the doped region.

2. The manufacturing method as claimed in claim 1, wherein in forming the recess in the substrate, the recess passes through the first insulation layer and the second insulation layer to expose a second lateral surface of the second insulation layer.

3. The manufacturing method as claimed in claim 1, wherein in forming the exciting layer in the recess, the first insulation layer is in contact with the first side of the exciting layer, and the second insulation layer is in contact with the second side of the exciting layer.

4. The manufacturing method as claimed in claim 1, wherein in forming the recess, the second insulation layer has a second lateral surface, and the second lateral surface is exposed from the recess.

5. The manufacturing method as claimed in claim 1, wherein in providing the substrate, the first insulation layer and the second insulation layer are STI (Shallow Trench Isolation) layers.

6. The manufacturing method as claimed in claim 1, wherein in forming the exciting layer in the recess, the exciting layer has a first refractive index; in providing the substrate, the first insulation layer has a second refractive index, and the second insulation layer has a third refractive index; wherein the first refractive index is greater than the second refractive index and the third refractive index.

7. The manufacturing method as claimed in claim 1, wherein in forming the exciting layer in the recess, the exciting layer is a germanium layer; in providing the substrate, the first insulation layer and the second insulation layer are silicon oxide layers.

8. The manufacturing method as claimed in claim 1, wherein in providing the substrate, the acute angle is less than 30 degrees.

9. The manufacturing method as claimed in claim 1, wherein in providing the substrate, the acute angle ranges between 19.5 degrees and 30 degrees.

10. The manufacturing method as claimed in claim 1, wherein in forming the exciting layer in the recess, a first TIR (Total Internal Reflection) interface is formed between the exciting layer and the first insulation layer, and a second TIR interface is formed between the exciting layer and the second insulation layer.

11. The manufacturing method as claimed in claim 1, wherein in forming the exciting layer in the recess, the exciting layer has a length and a width, and a ratio of the length to the width ranges between 10 and 40.

12. A manufacturing method of a photo detector, comprising:

provide a substrate, wherein a first STI layer, a second STI layer, a doped region and a waveguide are formed in the substrate;

forming a recess in the substrate; and forming a germanium layer in the recess, wherein the germanium layer has a light incident surface, a first side and a second side opposite to the first side, the first STI layer is in contact with the first side of the germanium layer, and the second STI layer is contact with the second side of the germanium layer, the waveguide is obliquely connected to the light incident surface of the germanium layer;

wherein the first STI layer has a first lateral surface exposed from the recess, the doped region has a lateral surface exposed from the recess, and the first lateral surface of the first STI layer extends to the lateral surface of the doped region.

13. The manufacturing method as claimed in claim 12, wherein forming the germanium layer in the recess, the germanium layer has a first refractive index; in providing the substrate, the first STI layer has a second refractive index, and the second STI layer has a third refractive index; wherein the first refractive index is greater than the second refractive index and the third refractive index.

14. The manufacturing method as claimed in claim 12, wherein in providing the substrate, the first STI layer and the second STI layer are formed of silicon oxide.

15. The manufacturing method as claimed in claim 12, wherein in providing the substrate, the waveguide obliquely is connected to the light incident surface of the germanium layer, there is an acute angle included between the light incident surface and an extension direction of the waveguide, and the acute angle is less than 30 degrees.

16. The manufacturing method as claimed in claim 12, wherein in providing the substrate, the waveguide obliquely is connected to the light incident surface of the germanium layer, there is an acute angle included between the light incident surface of the waveguide, and the acute angle ranges between 19.5 degrees and 30 degrees.

17. The manufacturing method as claimed in claim 12, wherein in forming the recess, the second STI layer has a second lateral surface, and the second lateral surface is exposed from the recess.

18. The manufacturing method as claimed in claim 12, wherein in forming the germanium layer in the recess, a first TIR interface is formed between the germanium layer and the first STI layer, and a second TIR interface is formed between the germanium layer and the second STI layer.

19. The manufacturing method as claimed in claim 12, wherein in forming the germanium layer in the recess, the germanium layer has a length and a width, and a ratio of the length to the width ranges between 10 and 40.

20. A manufacturing method of a photo detector, comprising:

providing a substrate, wherein a first insulation layer, a second insulation layer, a doped region and a waveguide are formed in the substrate;

forming a recess in the substrate, wherein the first insulation layer forms a first lateral surface, and the second insulation layer forms a second lateral surface; and forming an exciting layer in the recess, wherein the exciting layer is in contact with the first lateral surface and the second lateral surface, the exciting layer has a light incident surface, a first side and a second side opposite to the first side, the first lateral surface of the first insulation layer is in contact with the first side of the exciting layer, the second lateral surface of the second insulation layer is in contact with the second side of the exciting layer, the waveguide is obliquely connected to the light incident surface of the exciting layer, and there is an acute angle included between the light incident surface and an extension direction of the waveguide;

wherein the first lateral surface is exposed from the recess, the doped region has a lateral surface exposed from the recess, and the first lateral surface of the first insulation layer extends to the lateral surface of the doped region.

\* \* \* \* \*